(12) United States Patent
Liao et al.

(10) Patent No.: US 9,621,174 B2
(45) Date of Patent: Apr. 11, 2017

(54) FREQUENCY CALIBRATION METHOD FOR A VOLTAGE-CONTROLLED OSCILLATOR

(71) Applicant: Intel Corporation, Santa Clara, CA (US)

(72) Inventors: Fang-Ren Liao, New Taipei (TW); Shih-An Yu, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/709,712

(22) Filed: May 12, 2015

(65) Prior Publication Data

US 2016/0336945 A1 Nov. 17, 2016

(51) Int. Cl.
*H03L 7/00* (2006.01)
*H03L 7/24* (2006.01)
*H03B 5/12* (2006.01)
*H03L 7/099* (2006.01)

(52) U.S. Cl.
CPC .............. *H03L 7/24* (2013.01); *H03B 5/1265* (2013.01); *H03B 2200/005* (2013.01); *H03B 2201/011* (2013.01); *H03B 2201/025* (2013.01); *H03L 7/099* (2013.01)

(58) Field of Classification Search
CPC ..... H03L 7/24; H03L 7/099; H03B 2201/011; H03B 5/1265; H03B 2201/025; H03B 2200/005

USPC ... 331/1 R, 16, 18, 25, 36 C, 117 R, 117 FE, 331/167, 177 R, 179; 375/376
See application file for complete search history.

(56) References Cited

U.S. PATENT DOCUMENTS

| 7,746,182 B2 * | 6/2010 | Ramaswamy | .......... H03L 7/087 331/11 |
| 2005/0062551 A1 * | 3/2005 | Coppola | ................ H03L 7/099 331/36 C |
| 2008/0036506 A1 * | 2/2008 | Lam | .......................... G06F 1/08 327/45 |

* cited by examiner

*Primary Examiner* — Richard Tan
(74) *Attorney, Agent, or Firm* — Schiff Hardin LLP

(57) ABSTRACT

A frequency calibration method for calibrating an output frequency of a voltage-controlled oscillator is provided. The voltage-controlled oscillator includes a first capacitor bank, a second capacitor bank, and a third capacitor bank. The first capacitor bank and the third capacitor bank are initially disabled and the second capacitor bank is initially enabled. The method includes, when the initial output frequency is lower than a reference frequency, adjusting the capacitance of the second capacitor bank until the calibrated output frequency is greater than the reference frequency, and when the initial output frequency is greater than the reference frequency, enabling the first capacitor bank and gradually increasing the capacitance of the first capacitor bank until the calibrated output frequency is lower than the reference frequency.

8 Claims, 4 Drawing Sheets

FREQUENCY CALIBRATION METHOD FOR A VOLTAGE-CONTROLLED OSCILLATOR

BACKGROUND OF THE INVENTION

Field of the Invention

The present invention relates to a voltage-controlled oscillator, and more particularly to a frequency calibration method for the voltage-controlled oscillator.

Description of the Related Art

Electronic circuits often use clock signals to regulate and control their operation. Events in the electronic circuits are timed by rising and/or falling edges of the clock signals. Clock signals may be generated by a number of oscillating circuits, such as an LC voltage-controlled oscillator (VCO). In this type of oscillating circuit, an electrical charge is alternately accumulated and discharged to form the basis of the clock signal. The charge accumulates in inductors and capacitors of an LC tank circuit in the VCO, and the time needed for the charge to accumulate and discharge is based on the inductance and capacitance values. The frequency of the clock signal in one exemplary VCO may thus be controlled by varying the capacitance of the LC tank circuit in the VCO. For example, the VCO may include a voltage-controlled variable capacitor so that the voltage of a control signal may be used to control the output frequency.

BRIEF SUMMARY OF THE INVENTION

An embodiment of a frequency calibration method for calibrating the output frequency of a voltage-controlled oscillator is provided. The voltage-controlled oscillator comprises a first capacitor bank, a second capacitor bank, and a third capacitor bank. The capacitance of one capacitor unit in the second capacitor bank is lower than the capacitance of one capacitor unit in the first capacitor bank. The capacitance of one capacitor unit in the second capacitor bank is greater than the capacitance of one capacitor unit in the third capacitor bank. The method comprises turning off the first capacitor bank and the third capacitor bank; turning on the second capacitor bank; and adjusting the output frequency of the voltage-controlled oscillator by controlling the number of enabled unit capacitors in the second capacitor bank. When the output frequency is lower than a reference frequency, the method comprises disabling one capacitor unit in the second capacitor bank and adjusting the output frequency by controlling the number of enabled unit capacitors in the second capacitor bank. When the output frequency is greater than the reference frequency, the method comprises enabling at least one capacitor unit in the first capacitor bank until the output frequency is lower than the reference frequency.

An embodiment of a frequency calibration method for calibrating an output frequency of a voltage-controlled oscillator is provided. The voltage-controlled oscillator comprises a first capacitor bank, a second capacitor bank, and a third capacitor bank. The capacitance of one capacitor unit in the second capacitor bank is lower than the capacitance of one capacitor unit in the first capacitor bank. The capacitance of one capacitor unit in the second capacitor bank is greater than the capacitance of one capacitor unit in the third capacitor bank. The method comprises setting the capacitance of the first capacitor bank to be the minimum capacitance of the first capacitor bank; setting the capacitance of the third capacitor bank to be the minimum capacitance of the third capacitor bank; setting the capacitance of the second capacitor bank to be the maximum capacitance of the second capacitor bank; and determining whether the output frequency is greater than a reference frequency. When the output frequency is lower than the reference frequency, the method includes disabling one capacitor unit in the second capacitor bank and adjusting the output frequency by gradually increasing the capacitance of the second capacitor bank. When the output frequency is greater than the reference frequency, the method includes gradually increasing the capacitance of the first capacitor bank until the output frequency is lower than the reference frequency.

A frequency calibration method for calibrating an output frequency of a voltage-controlled oscillator is provided. The voltage-controlled oscillator comprises a first capacitor bank, a second capacitor bank, and a third capacitor bank. The capacitance of one capacitor unit in the second capacitor bank is lower than the capacitance of one capacitor unit in the first capacitor bank. The capacitance of one capacitor unit in the second capacitor bank is greater than the capacitance of one capacitor unit in the third capacitor bank. The method comprises disabling the first capacitor bank and the third capacitor bank; enabling the second capacitor bank; and determining whether an initial output frequency is greater than a reference frequency. When the initial output frequency is lower than the reference frequency, the method entails adjusting the capacitance of the second capacitor bank until the calibrated output frequency is greater than the reference frequency. When the initial output frequency is greater than the reference frequency, enabling the first capacitor bank and gradually increasing the capacitance of the first capacitor bank until the calibrated output frequency is lower than the reference frequency.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
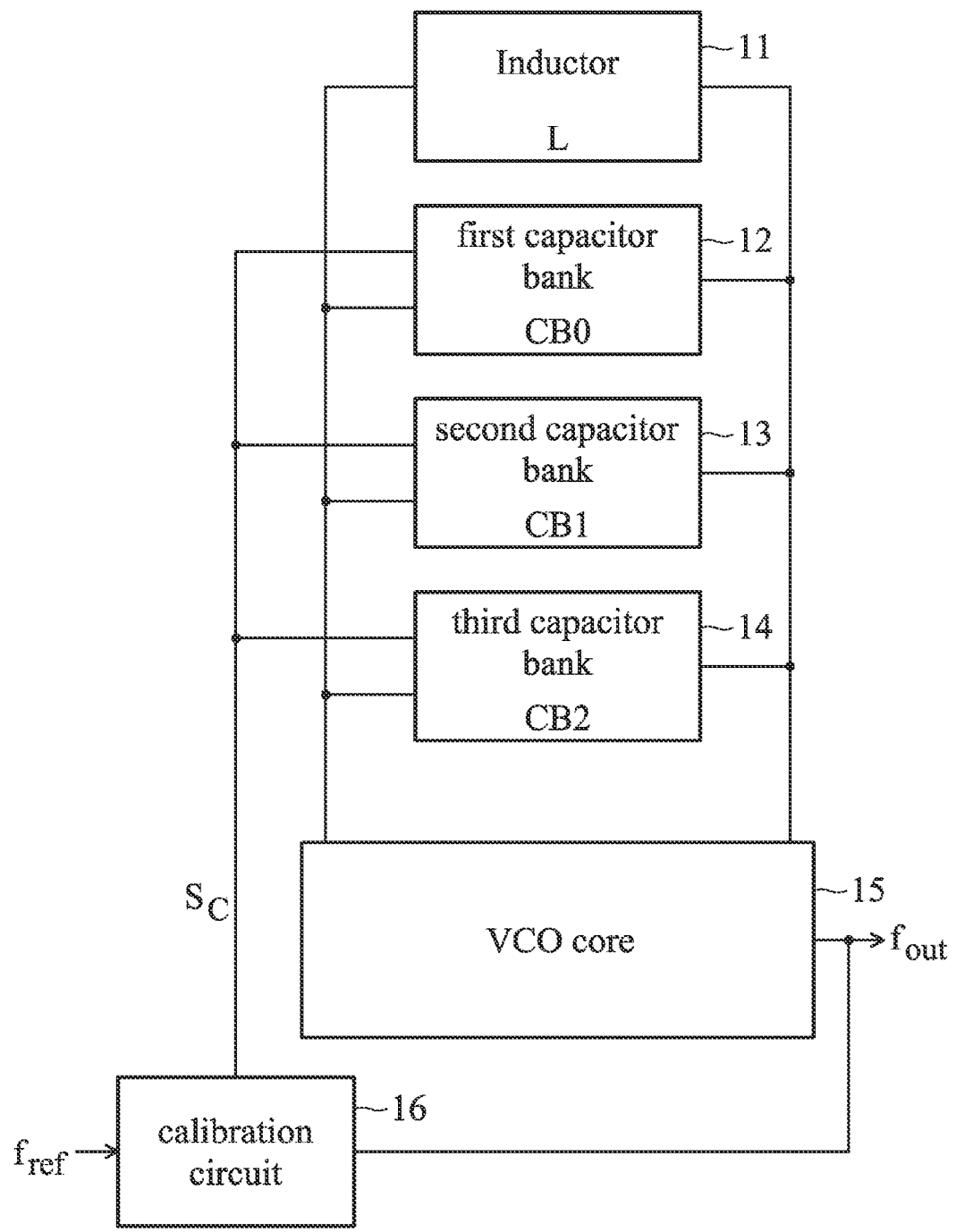
FIG. 1 is a schematic diagram of a voltage-controlled oscillator according to an embodiment of the invention.

FIG. 1 is a schematic diagram of a voltage-controlled oscillator according to an embodiment of the invention. The voltage-controlled oscillator comprises an inductor 11 (labeled L), a first capacitor bank 12 (labeled CB0), a second capacitor bank 13 (labeled CB1), a third capacitor bank 14 (labeled CB2), a VCO core 15, and a calibration circuit 16. The VCO core 15 generates an output frequency $f_{out}$ according to the inductance of the inductor 11 and the capacitance of the first capacitor bank 12, the second capacitor bank 13 and the third capacitor bank 14. The first capacitor bank 12, the second capacitor bank 13, and the third capacitor bank 14 comprise a plurality of unit capacitors and are controlled by the calibration circuit 16. In the embodiment, the capacitance of a unit capacitor in each capacitor bank is different. The capacitance of each unit capacitor in the first capacitor bank 12 is greater than the capacitance of each unit capacitor in the second capacitor bank 13, and the capacitance of each unit capacitor in the second capacitor bank 13 is greater than the capacitance of each unit capacitor in the third capacitor bank 14. In other words, assuming that the capacitance of a unit capacitor in the first capacitor bank 12 is $C_{u1}$, the capacitance of a unit capacitor in the second capacitor bank 13 is $C_{u2}$, and the capacitance of a unit capacitor in the third capacitor bank 14 is $C_{u3}$, the relationship between $C_{u1}$, $C_{u2}$ and $C_{u3}$ is as follows:

$$C_{u1} > C_{u2} > C_{u3}$$

The calibration circuit 16 receives and compares the output frequency $f_{out}$ and a reference frequency $f_{ref}$ to generate a control signal $S_c$ to control the first capacitor bank 12, the second capacitor bank 13 and the third capacitor bank 14. In one embodiment, the control signal $S_c$ comprises a first control signal to adjust the capacitance of the first capacitor bank 12, a second control signal to adjust the capacitance of the second capacitor bank 13, and a third control signal to adjust the capacitance of the third capacitor bank 14. If the voltage-controlled oscillator is a full digital voltage-controlled oscillator, the control signal $S_c$ is replaced by a binary tuning word to control the capacitances of the first capacitor bank 12, the second capacitor bank 13 and the third capacitor bank 14.

Figure 2:
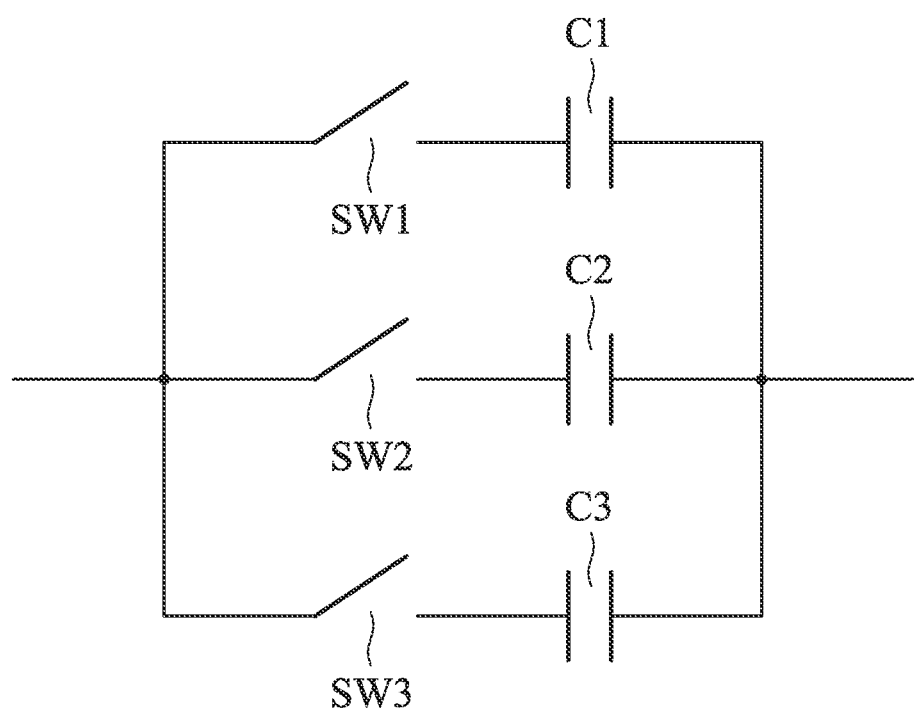
FIG. 2 is a schematic diagram of a capacitor bank.

FIG. 2 is a schematic diagram of a capacitor bank. The equivalent capacitance of the capacitor bank is determined based on the capacitors C1~C3. Assuming that only switch SW1 is on, the equivalent capacitance of the capacitor bank is C1. Assuming that switches SW1 and SW2 are on, the equivalent capacitance of the capacitor bank is (C1+C2). Therefore, assuming that switches SW1~SW3 are digitally controlled, a controller may adjust the equivalent capacitance of the capacitor bank to (C1+C2) by sending a binary tuning word [011] to the capacitor bank, for example. The first bit of the binary tuning word means the switch SW1 is turned on, the second bit of the binary tuning word means the switch SW2 is turned on, and the last bit of the binary tuning word means the switch SW3 is turned off.

In another embodiment, the binary tuning word can be expressed by a decimal form. For example, the decimal tuning word "0" means that no switch is turned on, the decimal tuning word "1" means that switch SW1 is turned on, and the decimal tuning word "3" means that switches SW1 and SW2 are turned on. When a switch is turned on, its corresponding capacitor works to change the equivalent capacitance of the capacitor bank.

Figure 3:
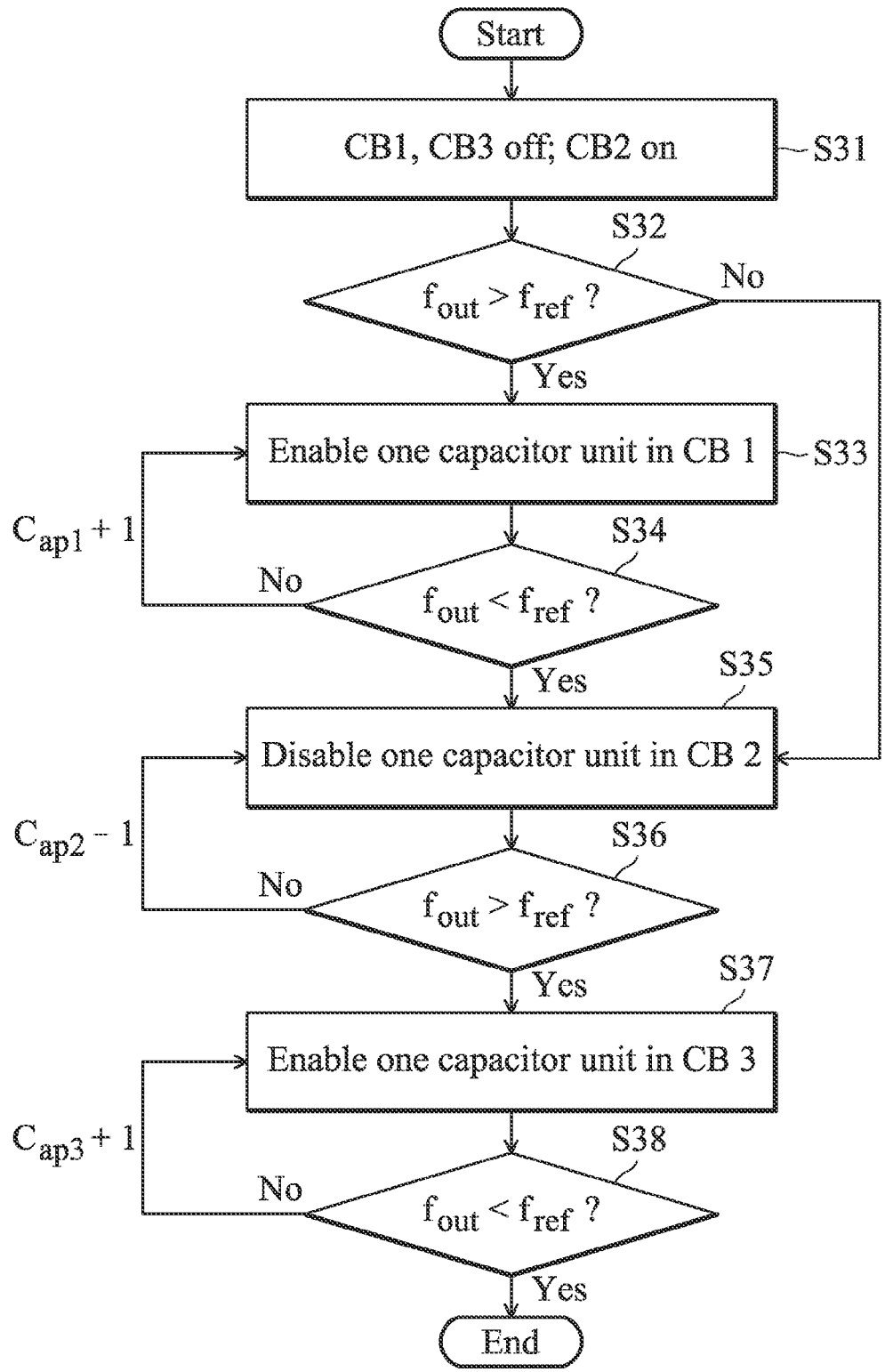
FIG. 3 is a frequency calibration method according to an embodiment of the invention.

FIG. 3 is a frequency calibration method according to an embodiment of the invention. The method in FIG. 3 is illustrated with the voltage-controlled oscillator shown in FIG. 1. In this embodiment, only three capacitor banks are illustrated, but the invention is not limited thereto. When the frequency calibration starts, the first capacitor bank 12 and the third capacitor bank 14 are turned off and only the second capacitor bank 13 is turned on in step S31. This means that the capacitance for the oscillator is determined only by the second capacitor bank 13. Assuming that the capacitance of the unit capacitor in the second capacitor bank 13 is C2 and the second capacitor bank 13 comprises N number of parallel connected capacitors, the capacitance of the second capacitor bank 13 is N*C2 when all the unit capacitors are enabled. If only (N−3) unit capacitors are enabled, the capacitance of the second capacitor bank 13 is (N−3)*C2. In other words, the capacitance of the second capacitor bank 13 is determined according to the number of enabled unit capacitors in the second capacitor bank 13. The first capacitor bank 12 and the third capacitor bank 14 operate in the same manner.

In step S32, the calibration circuit 16 determines whether the output frequency is greater than the reference frequency. If the frequency is greater than the reference frequency, step S33 is executed. In step S33, the calibration circuit enables one unit capacitor in the first capacitor bank 12. If the frequency is not greater than the reference frequency, step S35 is executed.

In the default setting, all the unit capacitors in the first capacitor bank 12 are disabled. This means that the equivalent capacitance of the first capacitor bank 12 is zero. Assuming that the capacitance of the unit capacitor in the first capacitor bank 12 is C1, step S33 means that the equivalent capacitance of the first capacitor bank 12 becomes C1. In step S34. The calibration circuit 16 determines whether the output frequency is lower than the reference frequency. If the frequency is not lower than the reference frequency, a first tuning word Cap1 is increased by 1 to enable one more unit capacitor in the first capacitor bank 12. In other words, the current equivalent capacitance of the first capacitor bank 12 is 2*C1.

If the frequency is lower than the reference frequency in step S34, step S35 is executed. In step S35, the calibration circuit 16 disables one unit capacitor in the second capacitor bank 13, i.e. the second tuning word Cap2 for the second capacitor bank 13 is decreased by 1. Then, in step S36, the calibration circuit 16 determines whether the output frequency is greater than the reference frequency. If the output frequency is not greater than the reference frequency, the calibration circuit 16 disables one more unit capacitor in the second capacitor bank 13.

If the output frequency is greater than the reference frequency, step S37 is executed. The calibration circuit 16 enables one unit capacitor in the third capacitor bank 14, i.e. the third tuning word Cap3 for the third capacitor bank 14 is increased by 1. Then, in step S38, the calibration circuit 16 determines whether the output frequency is lower than the reference frequency. If yes, the frequency calibration procedure is done. If not, the calibration circuit 16 enables one unit capacitor in the third capacitor bank 14, i.e. the third tuning word Cap3 for the third capacitor bank 14 is increased by 1.

Figure 4:
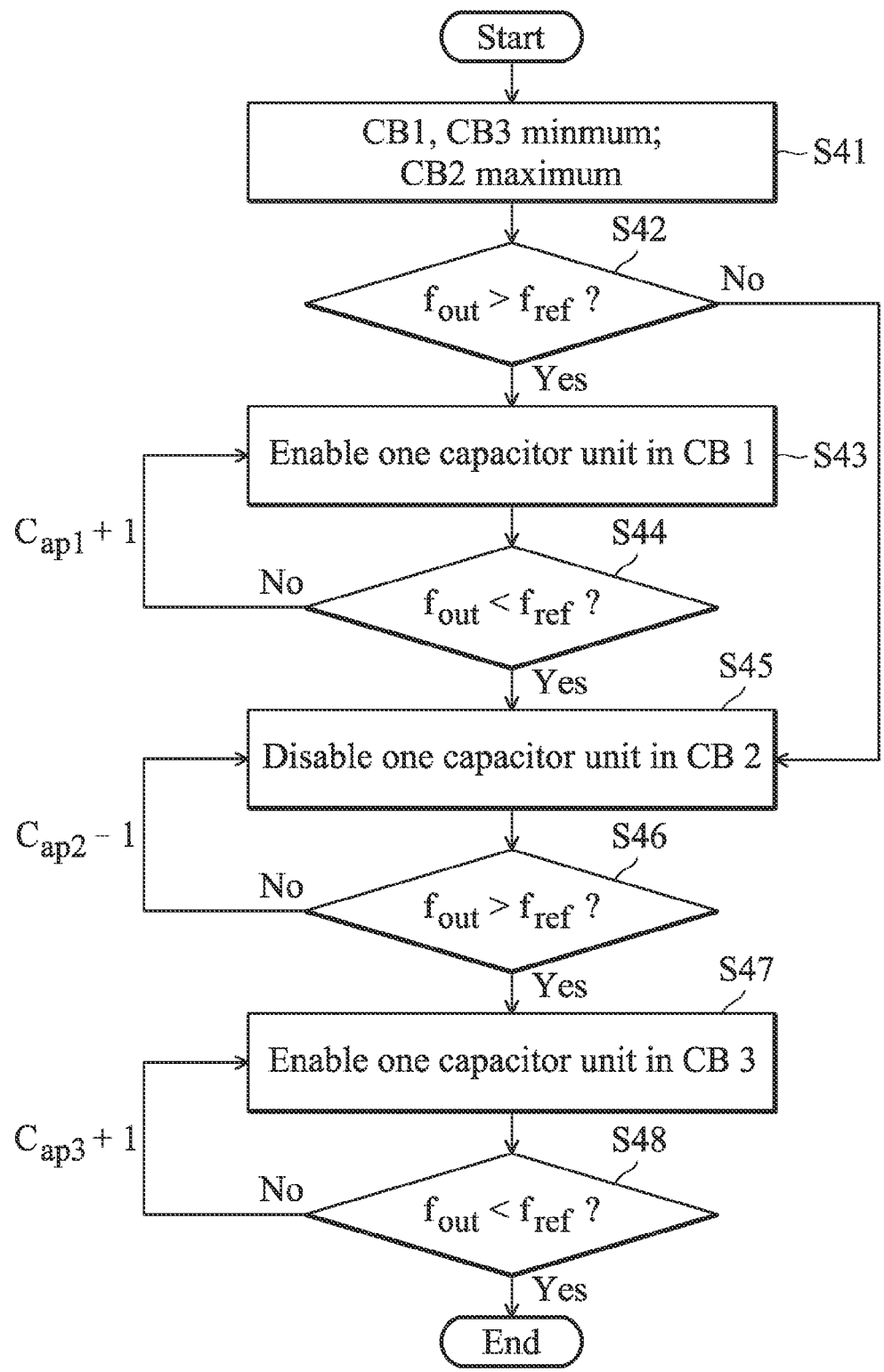
FIG. 4 is a frequency calibration method according to another embodiment of the invention.

FIG. 4 is a frequency calibration method according to another embodiment of the invention. The method in FIG. 4 is illustrated with the voltage-controlled oscillator shown in FIG. 1. In this embodiment, only three capacitor banks are illustrated, but the invention is not limited thereto. When the frequency calibration starts, the capacitance of the first capacitor bank 12 and the third capacitor bank 14 are each set to the corresponding minimum capacitance, and the capacitance of the second capacitor bank 13 is the maximum capacitance the second capacitor bank 13 has in step S41.

In step S42, the calibration circuit 16 determines whether the output frequency is greater than the reference frequency. If the frequency is greater than the reference frequency, step S43 is executed. In step S43, the calibration circuit enables one unit capacitor in the first capacitor bank 12. If the frequency is not greater than the reference frequency, step S45 is executed.

In step S44, the calibration circuit 16 determines whether the output frequency is lower than the reference frequency.

If the frequency is not lower than the reference frequency, a first tuning word Cap1 is increased by 1 to enable one more unit capacitor in the first capacitor bank 12.

If the frequency is lower than the reference frequency in step S44, step S45 is executed. In step S45, the calibration circuit 16 disables one unit capacitor in the second capacitor bank 13, i.e. the second tuning word Cap2 for the second capacitor bank 13 is decreased by 1. Then, in step S46, the calibration circuit 16 determines whether the output frequency is greater than the reference frequency. If the output frequency is not greater than the reference frequency, the calibration circuit 16 disables one more unit capacitor in the second capacitor bank 13.

If the output frequency is greater than the reference frequency, step S47 is executed. The calibration circuit 16 enables one unit capacitor in the third capacitor bank 14, i.e. the third tuning word Cap3 for the third capacitor bank 14 is increased by 1. Then, in step S48, the calibration circuit 16 determines whether the output frequency is lower than the reference frequency. If yes, the frequency calibration procedure is done. If not, the calibration circuit 16 enables one unit capacitor in the third capacitor bank 14, i.e. the third tuning word Cap3 for the third capacitor bank 14 is increased by 1.

According to above paragraphs, the proposed frequency calibration method starts by adjusting the capacitance of a first capacitor bank, wherein the first capacitor bank is not the largest or the smallest capacitor bank. When the capacitance of the selected capacitor bank is determined, the proposed frequency calibration method starts adjusting the capacitance of a second capacitor bank, wherein the unit capacitance in the second capacitor bank is greater than the unit capacitance in the first capacitor bank. When the capacitance of the second capacitor bank is determined, the proposed frequency calibration method starts adjusting a third capacitor bank, wherein the unit capacitance in the second capacitor bank is lower than the unit capacitance in the first capacitor bank. When the capacitance of the third capacitor bank is determined, the proposed frequency calibration method starts adjusting the capacitance of a fourth capacitor bank, wherein the unit capacitance in the fourth capacitor bank is greater than the unit capacitance in the second capacitor bank. According to the described calibration mechanism, the frequency calibration method stops when the capacitance of each capacitor bank is determined.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency calibration method for calibrating an output frequency of a voltage-controlled oscillator, wherein the voltage-controlled oscillator comprises a first capacitor bank, a second capacitor bank, and a third capacitor bank, wherein a capacitance of one capacitor unit in the second capacitor bank is lower than a capacitance of one capacitor unit in the first capacitor bank and the capacitance of one capacitor unit in the second capacitor bank is greater than a capacitance of one capacitor unit in the third capacitor bank, the method comprising:
turning off the first capacitor bank and the third capacitor bank;
turning on the second capacitor bank;
adjusting the output frequency of the voltage-controlled oscillator by controlling a number of enabled unit capacitors in the second capacitor bank;
determining whether an output frequency is greater than a reference frequency;
when the output frequency is lower than the reference frequency, disabling one capacitor unit in the second capacitor bank and adjusting the output frequency by controlling the number of enabled unit capacitors in the second capacitor bank; and
when the output frequency is greater than the reference frequency, gradually enabling at least one capacitor unit to increase capacitance in the first capacitor bank until the output frequency is lower than the reference frequency;
stopping adjustment of a number of enabled unit capacitors in the first capacitor bank when the output frequency is lower than the reference frequency; and
adjusting the output frequency by controlling the number of enabled unit capacitors in the second capacitor bank until the output frequency is greater than the reference frequency.

2. The method as claimed in claim 1, further comprising:
stopping adjustment of the number of enabled unit capacitors in the second capacitor bank when the output frequency is greater than the reference frequency; and
adjusting the output frequency by controlling a number of enabled unit capacitors in the third capacitor bank until the output frequency is lower than the reference frequency.

3. A frequency calibration method for calibrating an output frequency of a voltage-controlled oscillator, wherein the voltage-controlled oscillator comprises a first capacitor bank, a second capacitor bank, and a third capacitor bank, wherein a capacitance of one capacitor unit in the second capacitor bank is lower than a capacitance of one capacitor unit in the first capacitor bank and the capacitance of one capacitor unit in the second capacitor bank is greater than a capacitance of one capacitor unit in the third capacitor bank, the method comprising:
setting a capacitance of the first capacitor bank to be a minimum capacitance of the first capacitor bank;
setting a capacitance of the third capacitor bank to be a minimum capacitance of the third capacitor bank;
setting a capacitance of the second capacitor bank to be a maximum capacitance of the second capacitor bank;
determining whether the output frequency is greater than a reference frequency;
when the output frequency is lower than the reference frequency, disabling one capacitor unit in the second capacitor bank and adjusting the output frequency by gradually decreasing the capacitance of the second capacitor bank; and
when the output frequency is greater than the reference frequency, gradually increasing the capacitance of the first capacitor bank until the output frequency is lower than the reference frequency;
stopping increasing the capacitance of the first capacitor bank when the output frequency is lower than the reference frequency; and
adjusting the output frequency by gradually decreasing the capacitance of the second capacitor bank until the output frequency is greater than the reference frequency.

4. The method as claimed in claim 3, further comprising:
stopping adjustment of the capacitance of the second capacitor bank when the output frequency is greater than the reference frequency; and
adjusting the output frequency by increasing a capacitance of the third capacitor bank until the output frequency is lower than the reference frequency.

5. A frequency calibration method for calibrating an output frequency of a voltage-controlled oscillator, wherein the voltage-controlled oscillator comprises a first capacitor bank, a second capacitor bank, and a third capacitor bank, wherein a capacitance of one capacitor unit in the second capacitor bank is lower than a capacitance of one capacitor unit in the first capacitor bank and the capacitance of one capacitor unit in the second capacitor bank is greater than a capacitance of one capacitor unit in the third capacitor bank, the method comprising:
disabling the first capacitor bank and the third capacitor bank;
enabling the second capacitor bank;
determining whether an initial output frequency is greater than a reference frequency;
when the initial output frequency is lower than the reference frequency, adjusting a capacitance of the second capacitor bank until a calibrated output frequency is greater than the reference frequency; and
when the initial output frequency is greater than the reference frequency, enabling the first capacitor bank and gradually increasing a capacitance of the first capacitor bank until the calibrated output frequency is lower than the reference frequency;
stopping increasing and fixing capacitance of the first capacitor bank when the output frequency is lower than the reference frequency; and
adjusting the output frequency by gradually decreasing the capacitance of the second capacitor bank until the calibrated output frequency is greater than the reference frequency.

6. The method as claimed in claim 5, further comprising:
to stop decreasing and fixing the capacitance of the second capacitor bank when the output frequency is greater than the reference frequency; and
adjusting the output frequency by increasing a capacitance of the third capacitor bank until the calibrated output frequency is lower than the reference frequency.

7. A voltage-controlled oscillator, comprising:
an inductor;
a first capacitor bank;
a second capacitor bank;
a third capacitor bank, wherein the inductor, the first capacitor bank, second capacitor bank and the third capacitor bank are parallel connected;
a VCO core to generate an output frequency according to an inductance of the inductor and an equivalent capacitance of the first capacitor bank, the second capacitor bank and the third capacitor bank; and
a calibration circuit to compare the output frequency and a reference frequency to generate a control signal to control the equivalent capacitance, wherein the calibration circuit executes a frequency calibration method comprising:
turning off the first capacitor bank and the third capacitor bank;
turning on the second capacitor bank;
adjusting the output frequency of the voltage-controlled oscillator by controlling a number of enabled unit capacitors in the second capacitor bank;
determining whether an output frequency is greater than a reference frequency;
when the output frequency is lower than the reference frequency, disabling one capacitor unit in the second capacitor bank and adjusting the output frequency by controlling the number of enabled unit capacitors in the second capacitor bank; and
when the output frequency is greater than the reference frequency, gradually enabling at least one capacitor unit to increase capacitance in the first capacitor bank until the output frequency is lower than the reference frequency;
stopping adjustment of a number of enabled unit capacitors in the first capacitor bank when the output frequency is lower than the reference frequency; and
adjusting the output frequency by controlling the number of enabled unit capacitors in the second capacitor bank until the output frequency is greater than the reference frequency.

8. The voltage-controlled oscillator as claimed in claim 7, wherein the method further comprises:
stopping adjustment of the number of enabled unit capacitors in the second capacitor bank when the output frequency is greater than the reference frequency; and
adjusting the output frequency by controlling a number of enabled unit capacitors in the third capacitor bank until the output frequency is lower than the reference frequency.

* * * * *